United States Patent

Fronheiser et al.

(10) Patent No.: US 10,643,894 B2
(45) Date of Patent: May 5, 2020

(54) SURFACE AREA AND SCHOTTKY BARRIER HEIGHT ENGINEERING FOR CONTACT TRENCH EPITAXY

(71) Applicants: International Business Machines Corporation, Armonk, NY (US); GlobalFoundries, Inc., Grand Cayman (KY)

(72) Inventors: Jody Fronheiser, Delmar, NY (US); Shogo Mochizuki, Clifton Park, NY (US); Hiroaki Niimi, Cohoes, NY (US); Balasubramanian Pranatharthiharan, Watervliet, NY (US); Mark Raymond, Latham, NY (US); Tenko Yamashita, Schenectady, NY (US)

(73) Assignees: INTERNATIONAL BUSINESS MACHINES CORPORATION, Armonk, NY (US); GLOBALFOUNDRIES, INC. (KY)

(*) Notice: Subject to any disclaimer, the term of this patent is extended or adjusted under 35 U.S.C. 154(b) by 136 days.

(21) Appl. No.: 15/597,650

(22) Filed: May 17, 2017

(65) Prior Publication Data
US 2018/0006141 A1   Jan. 4, 2018

Related U.S. Application Data

(62) Division of application No. 15/196,335, filed on Jun. 29, 2016.

(51) Int. Cl.
*H01L 23/48* (2006.01)
*H01L 23/52* (2006.01)
(Continued)

(52) U.S. Cl.
CPC .. *H01L 21/76895* (2013.01); *H01L 21/02068* (2013.01); *H01L 21/285* (2013.01);
(Continued)

(58) Field of Classification Search
CPC ......... H01L 21/02068; H01L 21/76895; H01L 23/535; H01L 21/28537; H01L 29/66848;
(Continued)

(56) References Cited

U.S. PATENT DOCUMENTS 6,177,364 B1   1/2001 Huang
7,041,556 B2   5/2006 Gonzalez
(Continued)

OTHER PUBLICATIONS

Jody Fronheiser et al., "Surface Area and Schottky Barrier Height Engineering for Contact Trench Epitaxy", Related Application, U.S. Appl. No. 15/196,335, filed Jun. 29, 2016.
(Continued)

*Primary Examiner* — Jami Valentine Miller
*Assistant Examiner* — Dilinh P Nguyen
(74) *Attorney, Agent, or Firm* — Cantor Colburn LLP; Vazken Alexanian

(57) ABSTRACT

Forming a contact is disclosed. A trench through an interlayer dielectric layer is opened down to a substrate. The interlayer dielectric layer is formed on the substrate such that the substrate is the bottom surface of the trench. A cleaning process of the trench is performed. The bottom surface of the trench is recessed. A trench contact epitaxial layer is formed in the trench. An oxide layer is formed on top of the trench contact epitaxial layer in the trench. A metal oxide layer is formed on top of the oxide layer in the trench. A metal contact is formed on top of the metal oxide layer, where the oxide layer and the metal oxide layer together form a dipole layer.

16 Claims, 13 Drawing Sheets

(51) Int. Cl.
*H01L 21/4763* (2006.01)
*H01L 21/44* (2006.01)
*H01L 21/768* (2006.01)
*H01L 21/02* (2006.01)
*H01L 29/04* (2006.01)
*H01L 29/66* (2006.01)
*H01L 29/417* (2006.01)
*H01L 29/08* (2006.01)
*H01L 21/285* (2006.01)
*H01L 29/78* (2006.01)
*H01L 29/45* (2006.01)

(52) U.S. Cl.
CPC ...... *H01L 21/76814* (2013.01); *H01L 29/045* (2013.01); *H01L 29/0847* (2013.01); *H01L 29/0895* (2013.01); *H01L 29/41791* (2013.01); *H01L 29/66795* (2013.01); *H01L 21/28525* (2013.01); *H01L 21/76831* (2013.01); *H01L 29/456* (2013.01); *H01L 29/785* (2013.01)

(58) Field of Classification Search
CPC ............... H01L 29/045; H01L 29/0847; H01L 29/0895; H01L 29/41791; H01L 29/66795; H01L 21/285; H01L 21/76814

USPC ........ 257/774; 438/637, 639, 640, 667, 672, 438/675, 700
See application file for complete search history.

(56) References Cited

U.S. PATENT DOCUMENTS

| | | | |
|---|---|---|---|
| 9,704,904 B2 * | 7/2017 | Lai | H01L 27/1463 |
| 2007/0249168 A1 | 10/2007 | Rotondaro et al. | |
| 2013/0087810 A1 * | 4/2013 | Tsai | H01L 29/66545 257/77 |
| 2015/0064884 A1 | 3/2015 | Cheng et al. | |
| 2016/0035861 A1 * | 2/2016 | Park | H01L 29/66545 438/301 |
| 2017/0278893 A1 * | 9/2017 | Cheng | H01L 27/1463 |
| 2018/0006141 A1 | 1/2018 | Fronheiser et al. | |

OTHER PUBLICATIONS

List of IBM Patents or Patent Applications Treated as Related; (Appendix P), Filed Dec. 14, 2017; pp. 1-2.

* cited by examiner

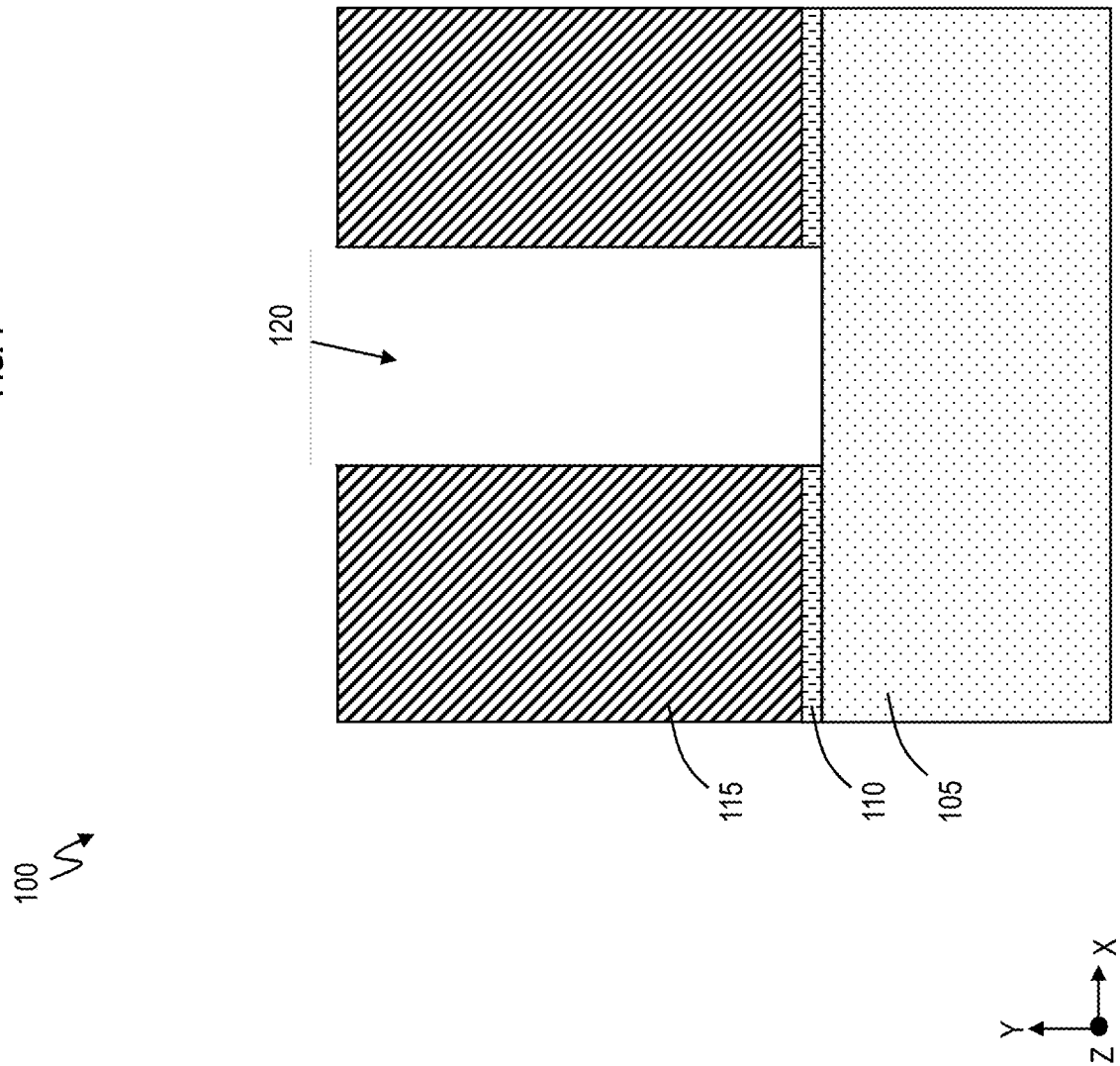

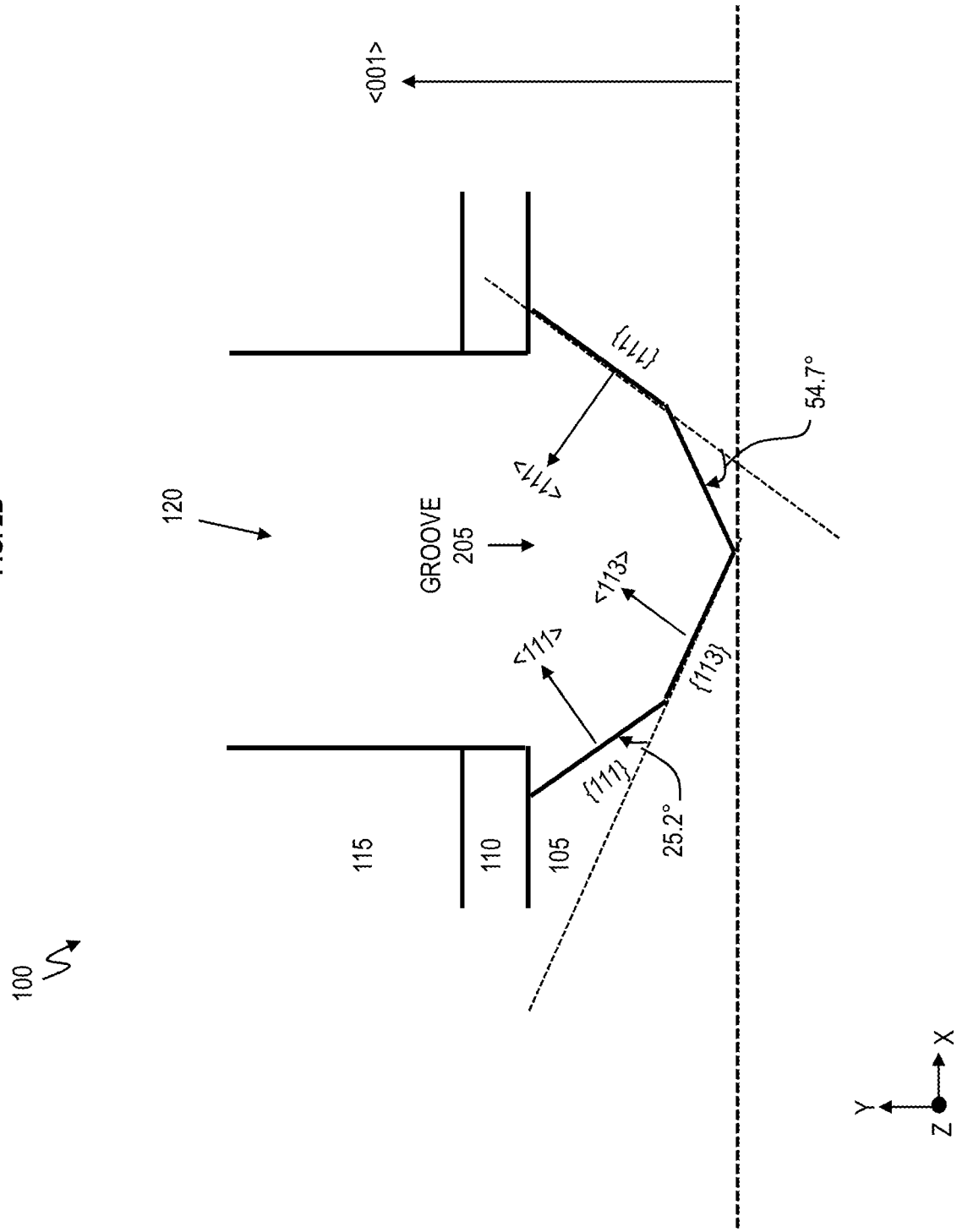

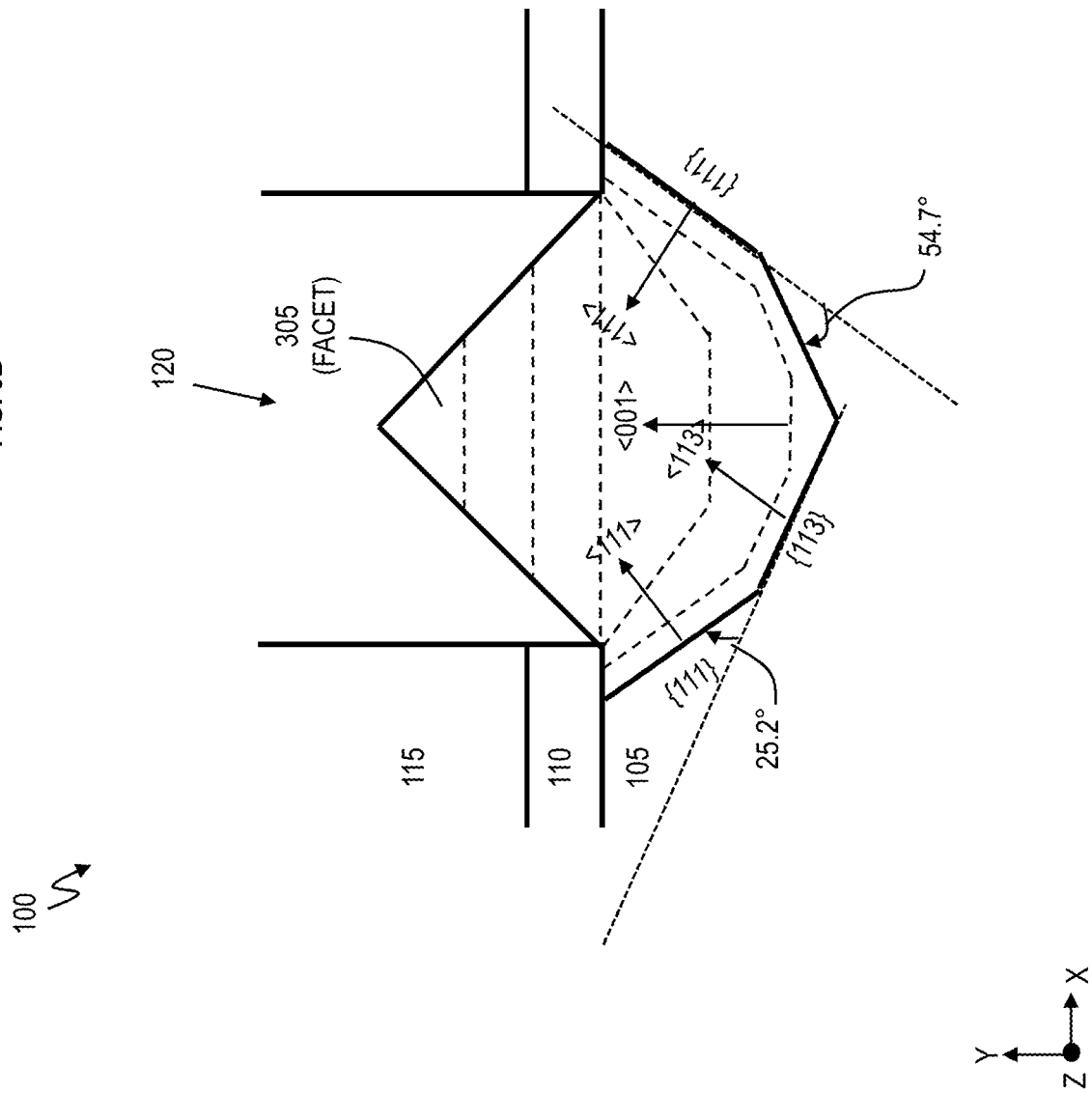

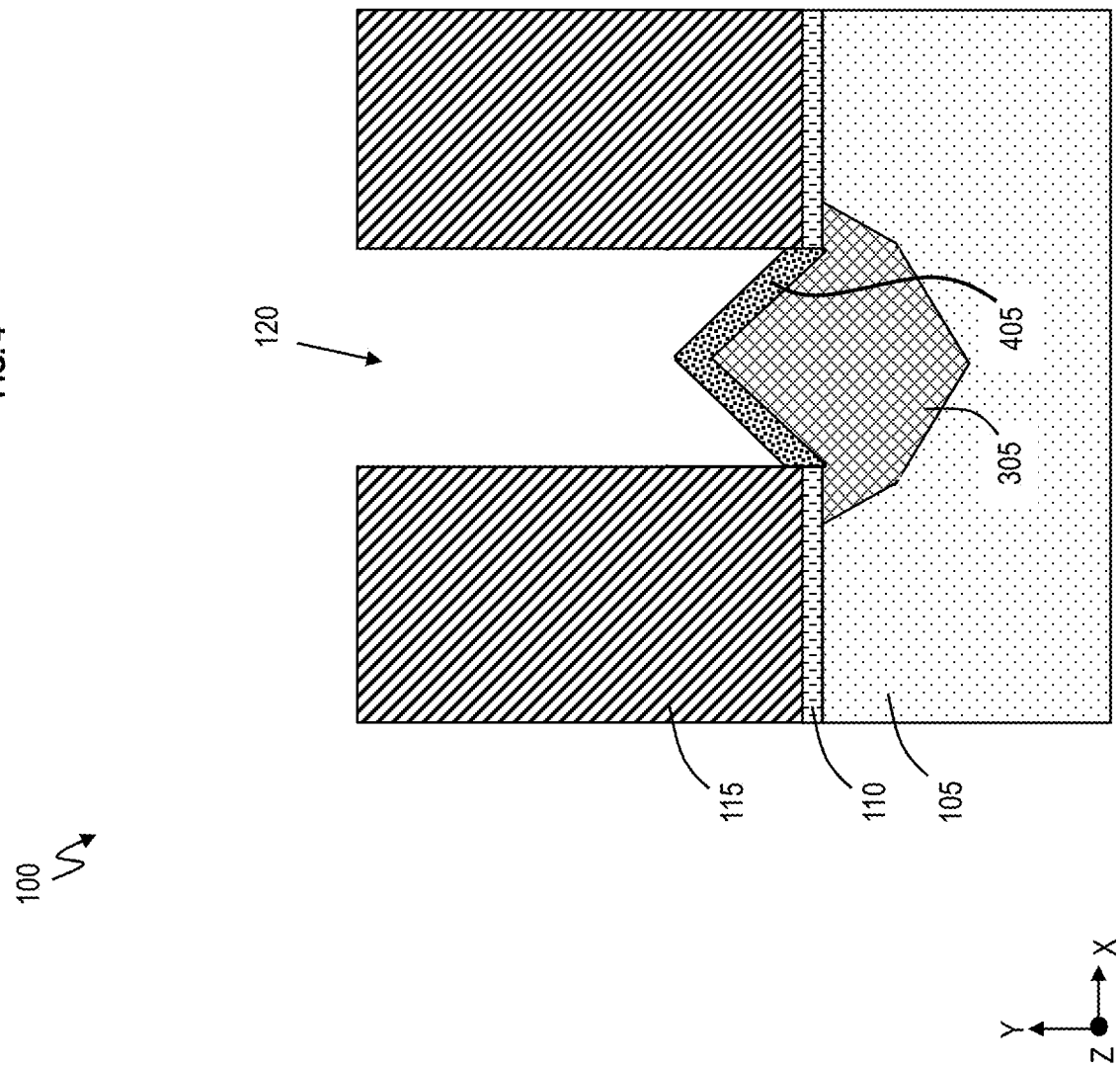

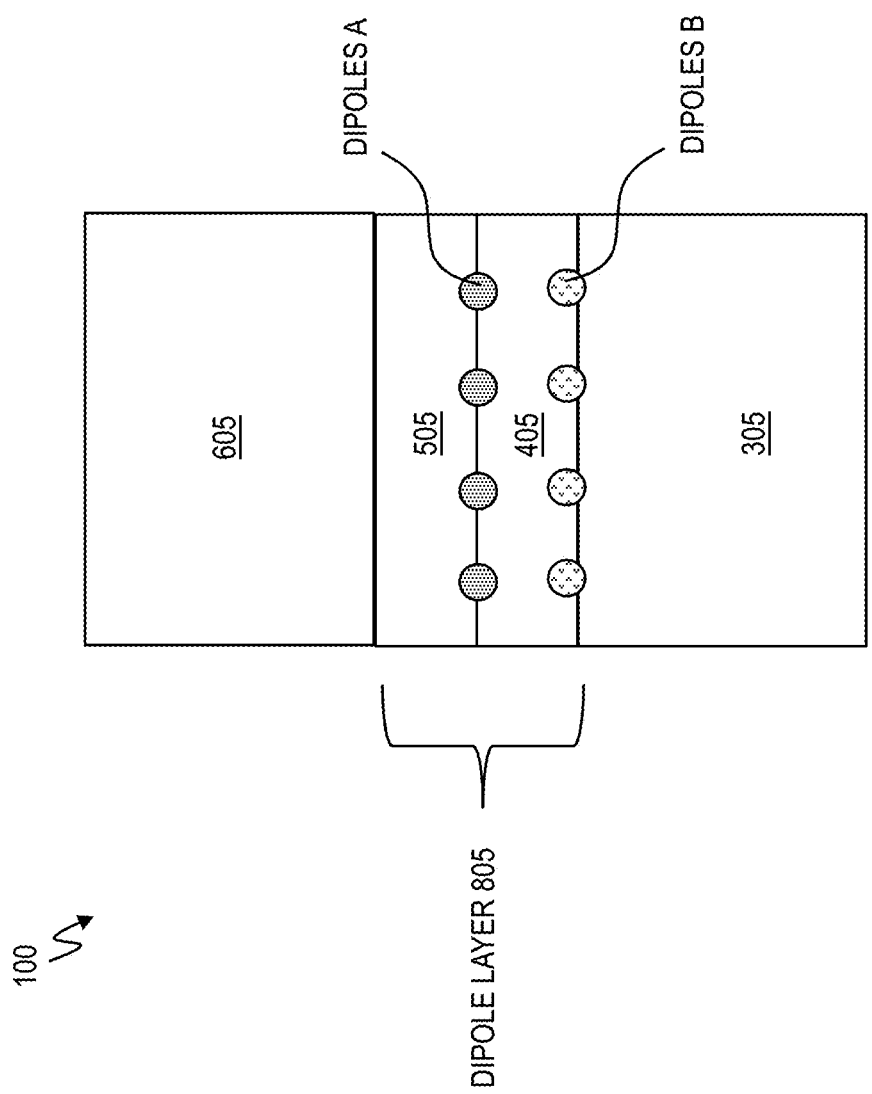

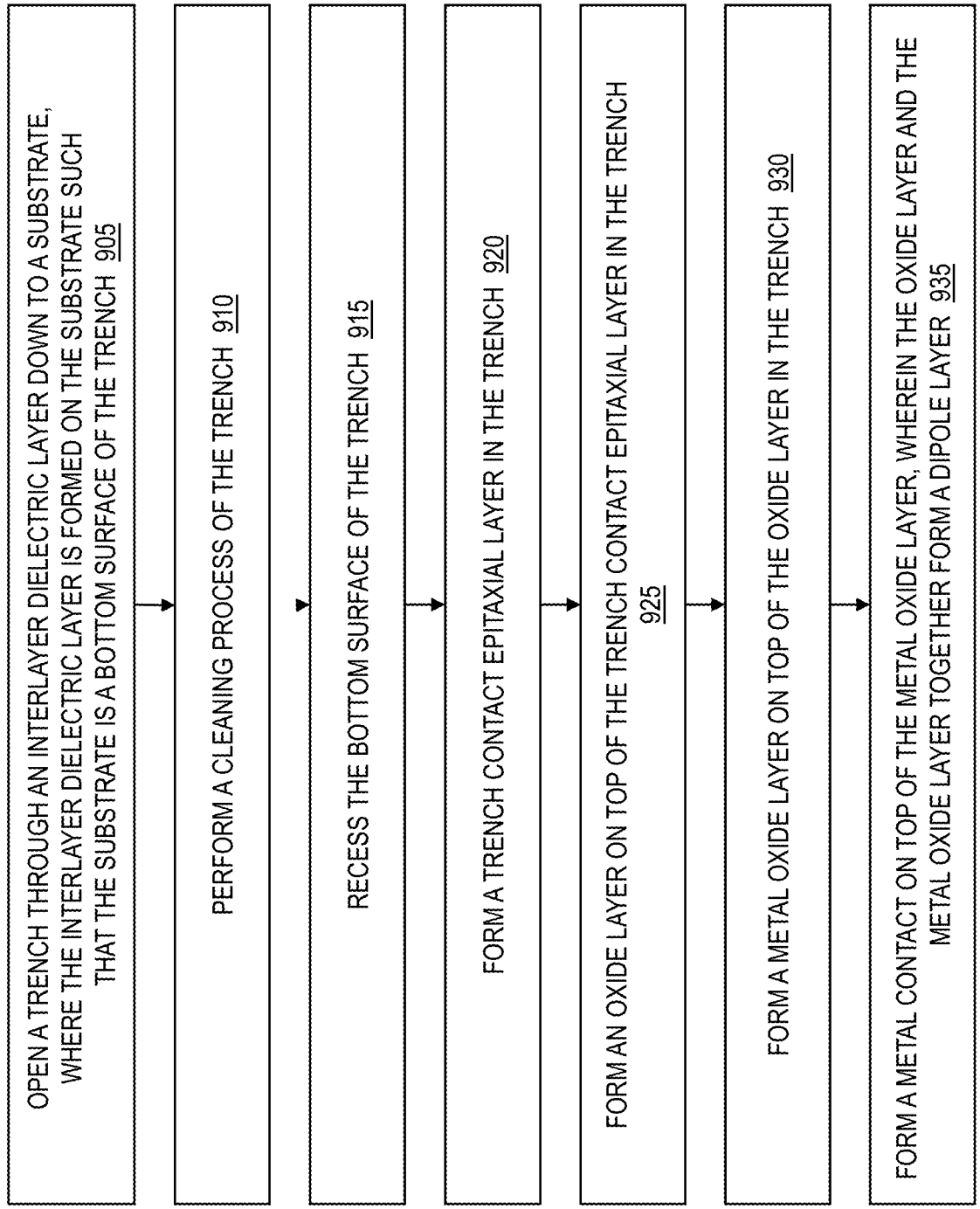

SURFACE AREA AND SCHOTTKY BARRIER HEIGHT ENGINEERING FOR CONTACT TRENCH EPITAXY

PRIORITY

This application is a divisional of U.S. Non-Provisional application Ser. No. 15/196,335, entitled "SURFACE AREA AND SCHOTTKY BARRIER HEIGHT ENGINEERING FOR CONTACT TRENCH EPITAXY", filed Jun. 29, 2016, which is incorporated herein by reference in its entirety.

BACKGROUND

The present invention relates to semiconductors, and more specifically, to surface area and Schottky barrier height (SBH) engineering for contact trench epitaxy.

A metal-oxide-semiconductor field-effect transistor (MOSFET) is a transistor used for switching electronic signals. The MOSFET has a source, a drain and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin type field effect transistor (FET) is a type of MOSFET. FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device.

SUMMARY

According to one or more embodiments, a method of forming a contact is provided. The method includes opening a trench through an interlayer dielectric layer down to a substrate, where the interlayer dielectric layer is formed on the substrate such that the substrate is a bottom surface of the trench. The method includes performing a cleaning process of the trench, recessing the bottom surface of the trench, forming a trench contact epitaxial layer in the trench. Also, the method includes forming an oxide layer on top of the trench contact epitaxial layer in the trench, forming a metal oxide layer on top of the oxide layer in the trench, and forming a metal contact on top of the metal oxide layer, where the oxide layer and the metal oxide layer together form a dipole layer.

According to one or more embodiments, a method of forming a contact is provided. The method includes performing a cleaning process of a trench, recessing a bottom surface of the trench in order to etch a grove with angled surfaces, and forming a trench contact epitaxial layer in the trench. Also, the method includes forming a dipole layer on top of the trench contact epitaxial layer and forming a metal contact on top of the dipole layer.

According to one or more embodiments, a contact for a semiconductor device is provided. The semiconductor device includes a trench contact epitaxial layer formed in a trench, a dipole layer formed on top of the trench contact epitaxial layer, and a metal contact formed on top of the dipole layer.

BRIEF DESCRIPTION OF THE DRAWINGS

FIG. 1 is a cross-sectional view of a structure according to one or more embodiments.

FIG. 2B is a drawing illustrating angled planes of the groove in the substrate according to one or more embodiments.

FIG. 3B is a drawing illustrating formation of facets for the epitaxial layer according to one or more embodiments.

FIG. 4 is a cross-sectional view of the structure depicting formation of an oxide layer according to one or more embodiments.

FIG. 8 is a conceptual view of the dipole layer in the structure according to one or more embodiments.

FIG. 9 is a flow chart of a method of forming a contact according to one or more embodiments.

DETAILED DESCRIPTION

Figure 2A:
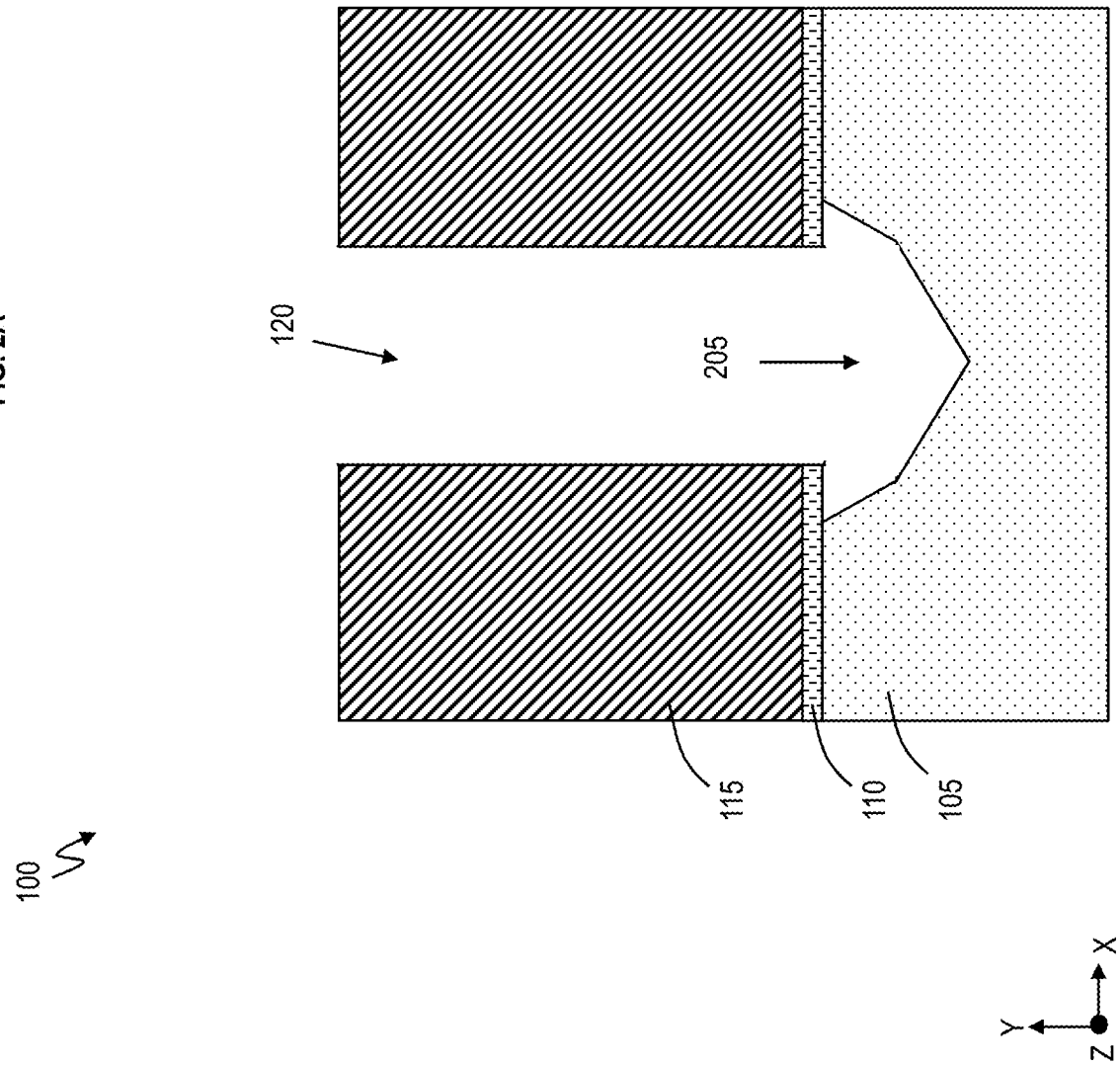
FIG. 2A is a cross-sectional view of the structure depicting etching into the substrate to form a groove according to one or more embodiments.

Various embodiments are described herein with reference to the related drawings. Alternative embodiments may be devised without departing from the scope of this document. It is noted that various connections and positional relationships (e.g., over, below, adjacent, etc.) are set forth between elements in the following description and in the drawings. These connections and/or positional relationships, unless specified otherwise, may be direct or indirect, and are not intended to be limiting in this respect. Accordingly, a coupling of entities may refer to either a direct or an indirect coupling, and a positional relationship between entities may be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Because of the aggressive scaling for complementary metal-oxide-semiconductor (CMOS) transistors from one node to the other, the dimension is also scaled by, for example, approximately 70% shrinkage of fin and gate pitch from node to node to meet device requirements. As a result of the aggressively scaled CMOS devices, it is desired to achieve low $10^{-9}$ $\Omega$-cm$^2$ of source/drain (S/D) contact resistivity (pc) to meet performance requirements for 7 nm technology devices and beyond. The source or drain contact may be referred to as contact, S/D contact, etc.

To address the aggressive scaling of CMOS devices, there should be an increase in the surface area for the bottom dimension of the S/D contact in order to reduce metal to semiconductor contact resistance. One or more embodiments discuss methods for reducing S/D contact resistance which include (1) surface area enhancement engineering and (2) lower Schottky barrier height (SBH) engineering.

According to one or more embodiments, the disclosed surface area enhancement methodologies involve reducing the contact resistance by having a large cross-section between the semiconductor layer (e.g., epitaxial layer) and the metal layer (e.g., metal liner or metal contact) because large cross-sections have a small resistance. The disclosed surface area enhancement further includes providing a clean surface and forming an epitaxial layer with facets along a contact trench.

Schottky barrier height (SBH) reduction, in one or more embodiments, provides a way to decrease contact resistivity. The Schottky barrier height is an intrinsic property which may be modified as disclosed in more detail subsequently herein. A dipole layer is formed to reduce SBH according to one or more embodiments. The disclosed dipole formation, in one or more embodiments, requires a clean surface so that the optimized dipole layer reduces contact resistivity (pc).

Now turning to the figures, FIG. 1 is a cross-sectional view of a structure 100 according to one or more embodiments. The structure 100 is a semiconductor device. The structure 100 may be a transistor such as a finFET device, which is discussed in the as one example of the structure 100. Although examples are directed to the source and/or drain contact formation for a finFET device, the techniques discussed herein apply to source/drain contacts for any transistor.

FIG. 1 illustrates an etch stopper layer (ESL) 110 formed on a substrate 105 and an interlayer dielectric (ILD) layer 115 formed on top of the layer 110. The substrate 105 may be a fin. A contact trench 120 is formed through the interlayer dielectric layer 115 and the ESL 110 down to the fin 105 using standard lithography processes. In one implementation, the contact trench 120 may be formed by reactive ion etching (RIE). In one implementation, the ESL 110 may not be present such that the interlayer dielectric layer 115 is formed on top of the substrate 105.

For an n-type transistor, the fin 105 may be a semiconductor material such as silicon, etc. For a p-type transistor, the fin 105 may be a semiconductor material such as germanium, silicon germanium, etc. The interlayer dielectric layer 115 may be a low-k dielectric material. The layer 110 may be a dielectric layer such as a nitride layer. In one implementation, the layer 110 may be silicon nitride (SiN).

In a state-of-the-art system, an ex-situ directional surface clean, for example, gas cluster ions of $NF_3$ based gas phase may be utilized to clean the surface of the trench. However, there is nitride residue that remains after the cleaning, which prevents the facet growth of the epitaxial layer and prevents the reduction in contact resistivity (pc) discussed herein.

After the $H_2$ bake, the in-situ pre-trench epitaxy clean may be a plasma $NH_3$ (ammonia) and $NF_3$ (nitrogen trifluoride which is a nitrogen-fluorine compound) clean of the contact trench 120.

According to one or more embodiments, surface area enhancement engineering is a further cleaning process that includes a hydrogen gas ($H_2$) bake (for a predefined time, temperature, and pressure) and an in-situ pre-trench epitaxy clean. In one implementation of the $H_2$ bake, the predefined time may range from about 1 to about 10 minutes, the predefined temperature may range from about 400 degrees Celsius (° C.) to about 900° C. depending on thermal budget limitation, and the predefined pressure may range from about 1 Torr to 600 Torr.

FIG. 2A is a cross-sectional view of the structure 100 depicting etching into the substrate to form a groove 205 according to one or more embodiments. In one implementation, a hydrochloric acid (HCl) etch may be performed to recess the substrate 105 in order to form the crystalline groove 205. The HCl etch is designed to be highly anisotropic etching along the planes at angles defined by the bottom surface plane of the bottom of the trench 120 prior to etching. FIG. 2B is a drawing that illustrates the angled planes of the groove 205 in the substrate 105 according to one or more embodiments. The additional cleaning allows for the groove 205 to be etched with the angled planes because a selective etch may be utilized. Example angled planes of the groove 305 are the {111} and {113}. The plane {001} is parallel to the original bottom surface plane of the trench 120.

Figure 2C:
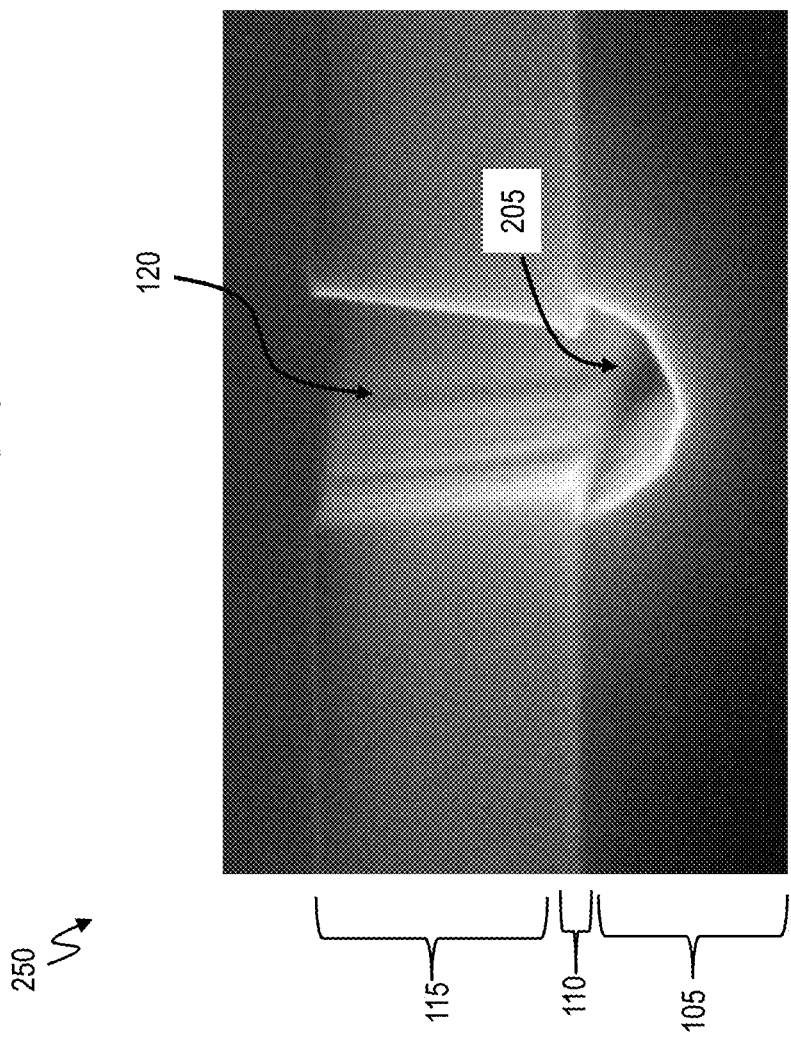
FIG. 2C is a scanning electron microscope (SEM) image illustrating the groove formed in the substrate according to one or more embodiments.

FIG. 2C is a scanning electron microscope (SEM) image 250 illustrating the groove 205 formed in the substrate 105 according to one or more embodiments. In this image 250, the substrate 105 is silicon and the layer 110 is SiN. The SEM image 250 shows that the groove 205 extends for the length of the contact trench 120.

Figure 3A:
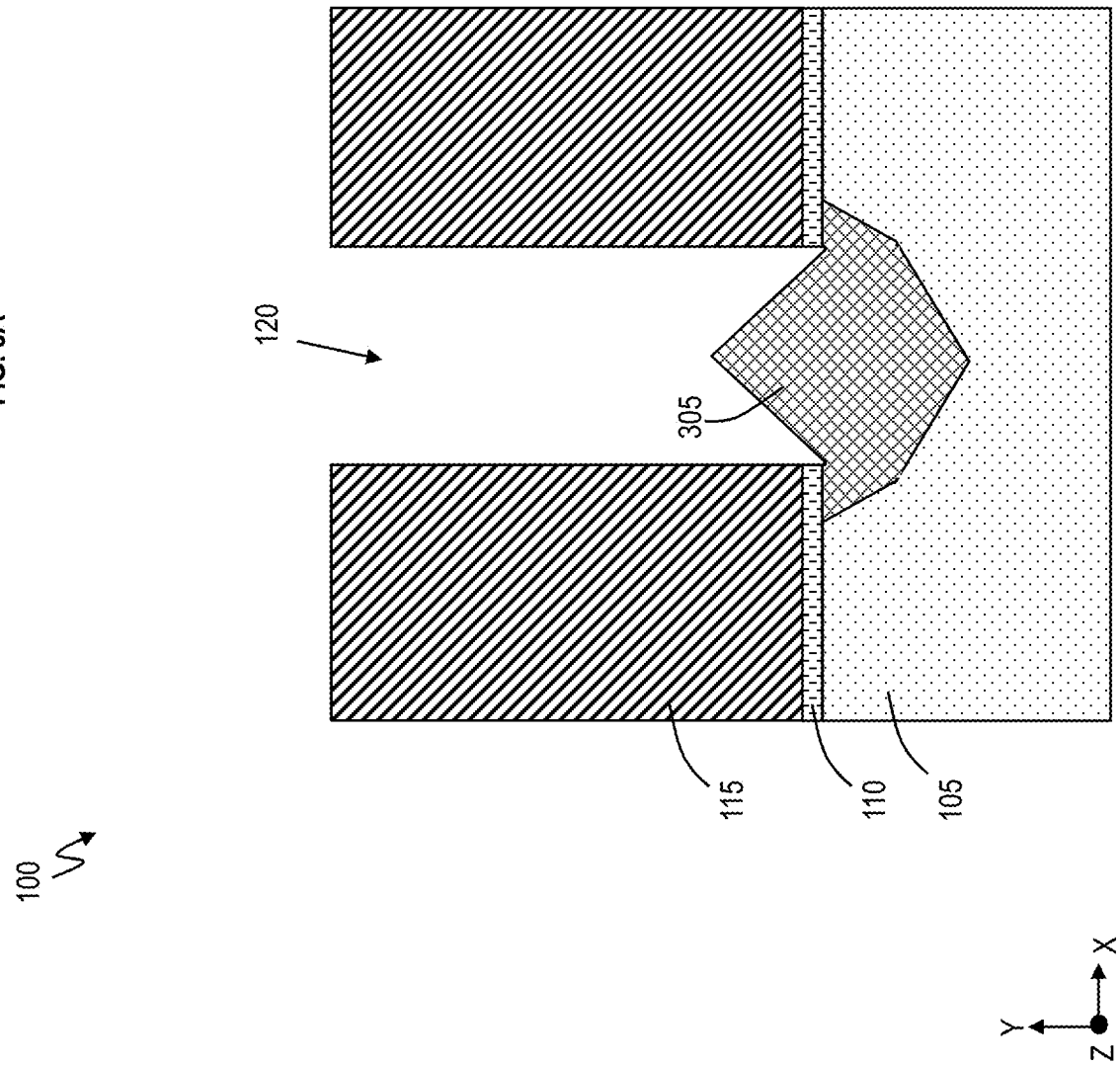
FIG. 3A is a cross-sectional view of the structure depicting trench contact epitaxy formed in the groove and trench according to one or more embodiments.

FIG. 3A is a cross-sectional view of the structure 100 depicting trench contact epitaxy in the groove 205 and in the contact trench 120 according to one or more embodiments. Because of the groove 205 being formed with angled planes and because of the additional cleaning, a trench contact epitaxial (epi) layer 305 is grown to faceted surfaces. The trench contact epitaxial layer 305 may be referred to as an epi contact, epitaxy, p-type epi, n-type epi, etc. The trench contact epitaxial layer 305 is a dual layer contact surface that has a diamond shape. The diamond shape provides more surface area to physically contact the trench contact epitaxial layer 305.

An epitaxial layer is formed to have the crystalline structure of the layer underneath. In this case, the trench contact epitaxial layer 305 is grown to have the crystalline structure of the substrate 105, and the trench contact epitaxial layer 305 is the source or drain of the transistor according to the location on the fin.

For n-type trench contact epitaxy, the epitaxial layer 305 may be formed as silicon doped with phosphorus (Si:P), silicon doped with arsenic (Si:As), etc. For p-type trench contact epitaxy, the epitaxial layer 305 may be formed as germanium doped with boron (Ge:B), silicon germanium doped with boron (SiGe:B), etc.

FIG. 3B is a drawing that illustrates the formation of facets for the epitaxial layer 305 through the contact trench 120 according to one or more embodiments. FIG. 3B illustrates the epitaxial growth along <001>, <111>, and <113> directions such that the faceted epitaxial layer 305 is grown in the groove 205 and the contact trench 120. For the trench epitaxy, silicon epitaxial growth rate of <001> direction is around 10 times (10x) faster than that of <111> direction. As the epitaxial growth time is increased, the facet for the epitaxial layer 305 is formed.

Figure 3C:
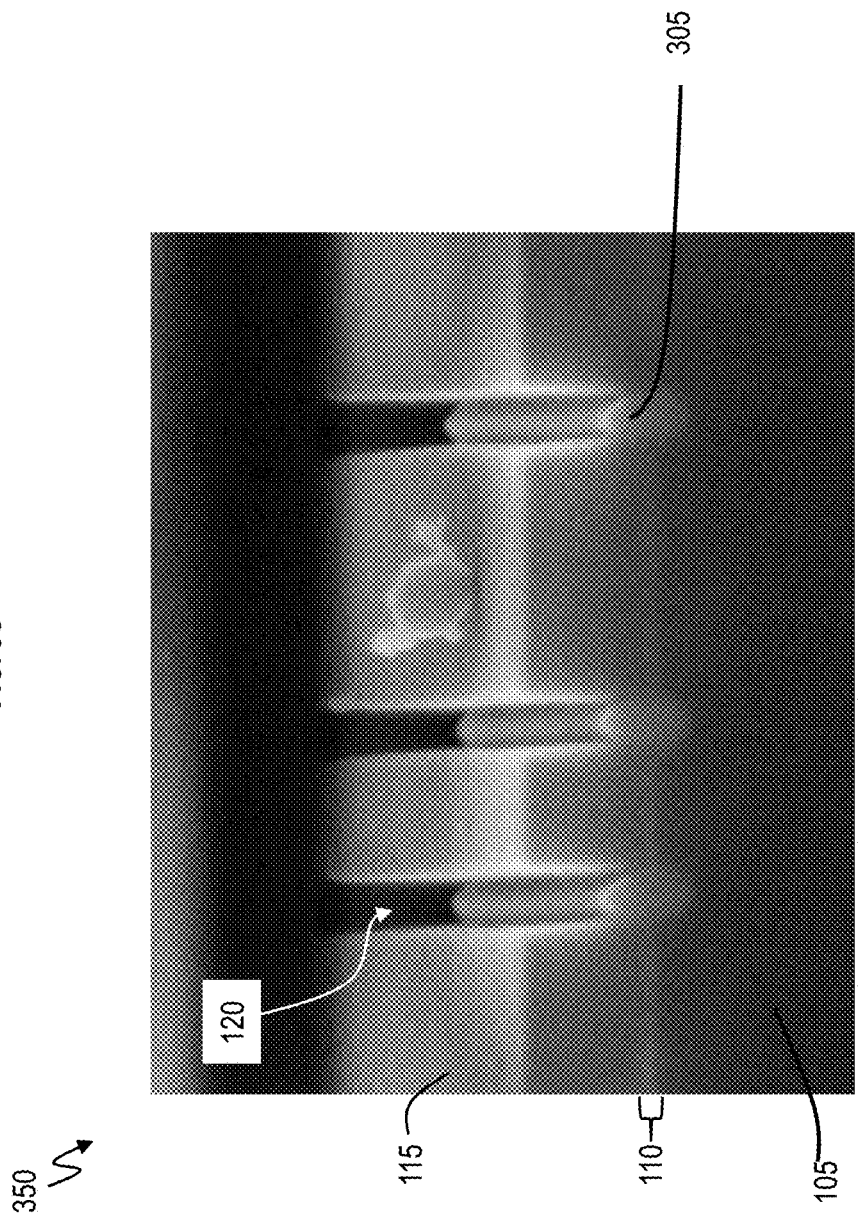
FIG. 3C is a scanning electron microscope (SEM) image illustrating the epitaxial layer grown in the contact trenches according to one or more embodiments.

FIG. 3C is a scanning electron microscope (SEM) image 350 illustrating the epitaxial layer 305 grown in the contact trenches 120 according to one or more embodiments. The STEM image 350 shows that the epitaxial layers 305 are each formed the length of the contact trench 120 with the facets, as a result of the prior surface area enhancement engineering. FIG. 3C is an example for a p-type fin/substrate but applies to n-type fins/substrates. In the STEM image 350, the substrate 105 is silicon germanium (SiGe) and the epitaxial layer 305 in the contact trenches 120 is germanium doped with boron (Ge:B).

In addition to the doping discussed above for respective n-type and p-type epitaxial layers 305, ion implantation may be performed to further provide additional dopants. For n-type transistors, the epitaxial layer 305 may be further doped with phosphorous, arsenic, and/or antimony. For p-type transistors, the epitaxial layer 305 may be further doped with boron, boron fluoride, aluminum, gallium, and/or indium.

Also, annealing may be performed. In one implementation, a laser based anneal may be used for solid/liquid phase epitaxy.

Now turning to Schottky barrier height engineering to reduce the Schottky barrier height (SBH), this includes formation of a dipole layer (e.g., dipole layer 805 in FIG. 8) to reduce the Schottky barrier height. The dipole layer may be a metal oxide layer 505 formed on top of an oxide layer 405 depicted in FIGS. 4 and 5. This dipole formation requires a clean surface as provided above. The optimized dipole layer reduces contact resistance (pc) between the epitaxial layer 305 and the metal contact 605 (e.g., titanium) depicted in FIG. 6.

With regard to the oxide layer of the dipole layer, FIG. 4 is a cross-sectional view of the structure 100 depicting formation of an oxide layer 405 according to one or more embodiments. The oxide layer 405 is formed on top of the epitaxial layer 305 in the trench 120. In one implementation, the oxide layer 405 may be silicon dioxide. The oxide layer 405 is a normal-k dielectric material, unlike, for example, hafnium oxide which is a high-k dielectric material. The thickness of the oxide layer 405 may range from about 0.3 nm to 2.0 nm. The oxide layer 405 may be formed by chemical oxide layer formation ($O_3$), as an example.

Figure 5:
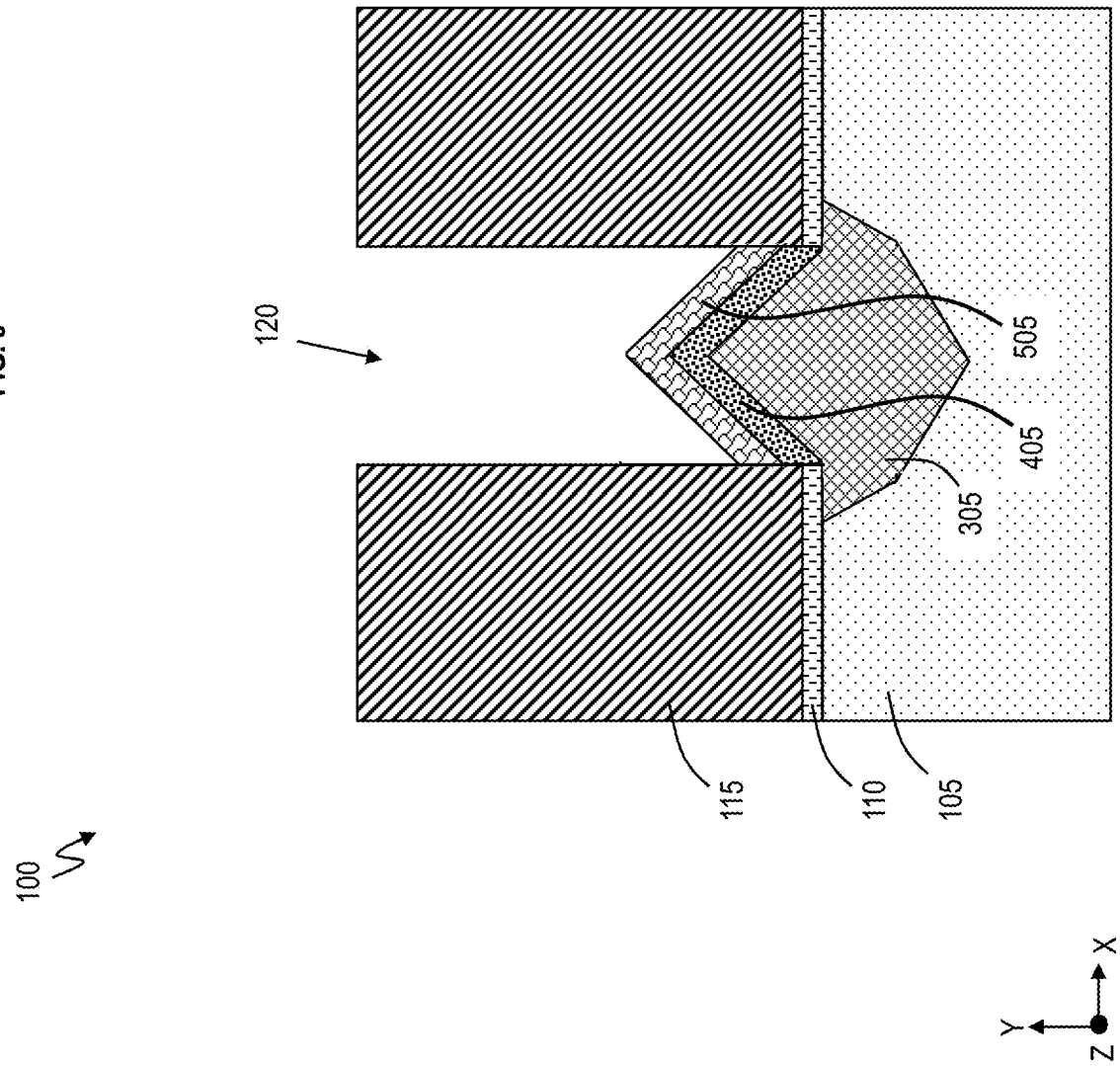
FIG. 5 is a cross-sectional view of the structure depicting formation of a metal oxide layer according to one or more embodiments.

With regard to the metal oxide layer of the dipole layer, FIG. 5 is a cross-sectional view of the structure 100 depicting formation of a metal oxide layer 505 according to one or more embodiments. The metal oxide layer 505 is formed on top of the oxide layer 405 in the trench 120. In one implementation, the metal oxide layer 505 may be deposited by atomic layer deposition (ALD).

As discussed herein, the combination of the oxide layer 405 and the metal oxide layer 505 together forms the dipole layer. For n-type transistors, the metal oxide layer 505 may be lanthanum oxide ($La_2O_3$). Other examples of the metal oxide layer 505 for n-type transistors may include germanium oxide ($GeO_2$), yttrium oxide ($Y_2O_3$), Lutetium oxide ($Lu_2O_3$), strontium oxide (SrO), and so on.

For p-type transistors, the metal oxide layer 505 may be aluminum oxide ($Al_2O_3$). Other examples of the metal oxide layer 505 for p-type transistors may include titanium oxide ($TiO_2$), zirconium oxide ($ZrO_2$), hafnium oxide ($HfO_2$), magnesium oxide (MgO), and so on.

Figure 6:
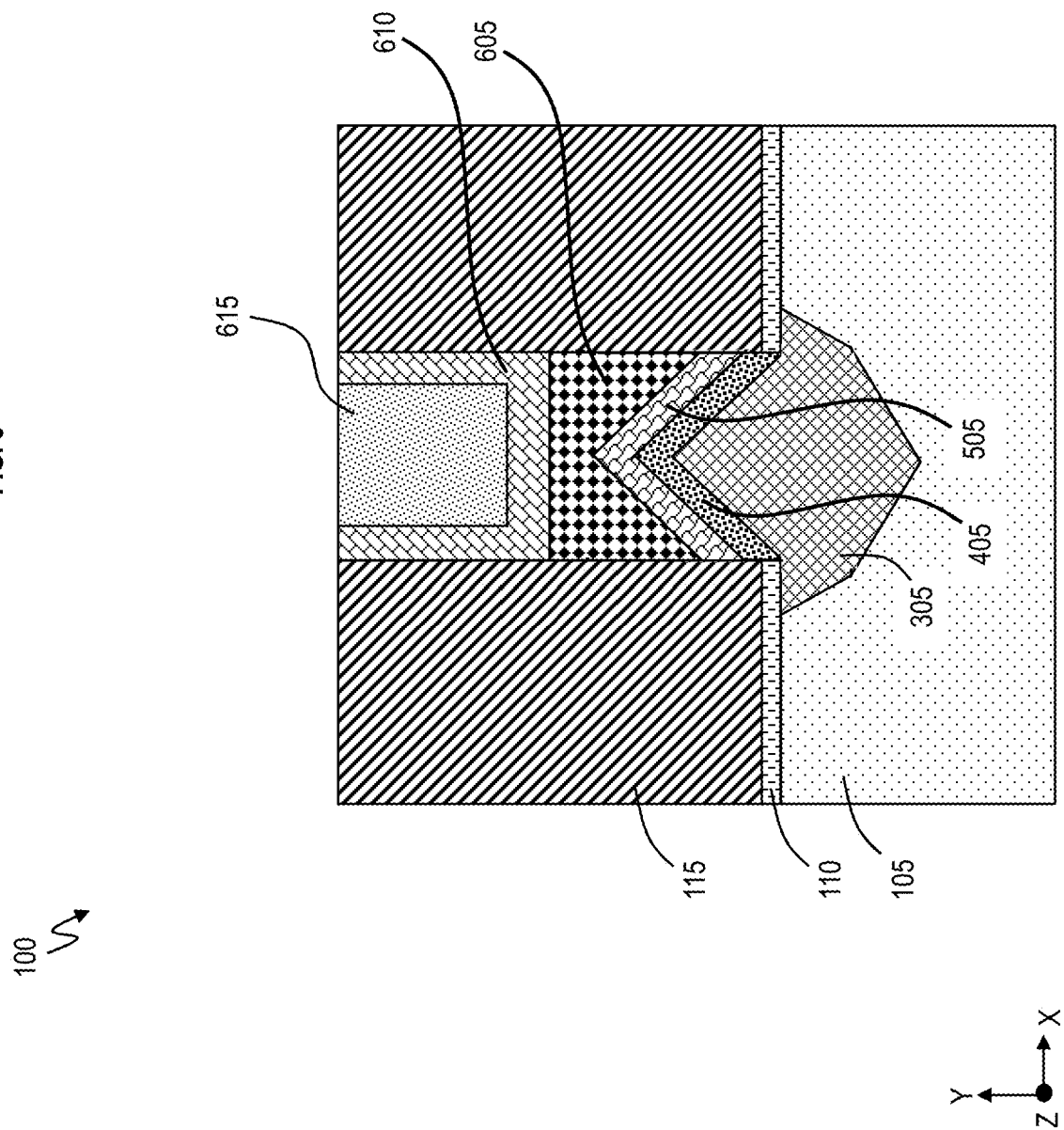
FIG. 6 is a cross-sectional view of the structure depicting metal liner deposition, barrier metal deposition, and metal plug deposition according to one or more embodiments.

FIG. 6 is a cross-sectional view of the structure 100 depicting metal liner deposition, barrier metal deposition, and metal plug deposition according to one or more embodiments.

A metal liner 605 is formed on top of the metal oxide layer 505 in the trench 120. The metal liner 605 may be referred to as the metal contact. An example of the metal liner 605 may be titanium.

A metal barrier layer 610 is formed on top of the metal liner 605 in the trench 120. An example of the metal barrier layer 610 may be titanium nitride.

Metal plug deposition includes forming a metal layer 615 on top of the metal barrier layer 610. Example materials of the metal layer 615 may include tungsten (W), cobalt (Co), etc. The entire top surface of the structure 100 is planarized, for example, by chemical mechanical planarization/polishing (CMP).

Figure 7:
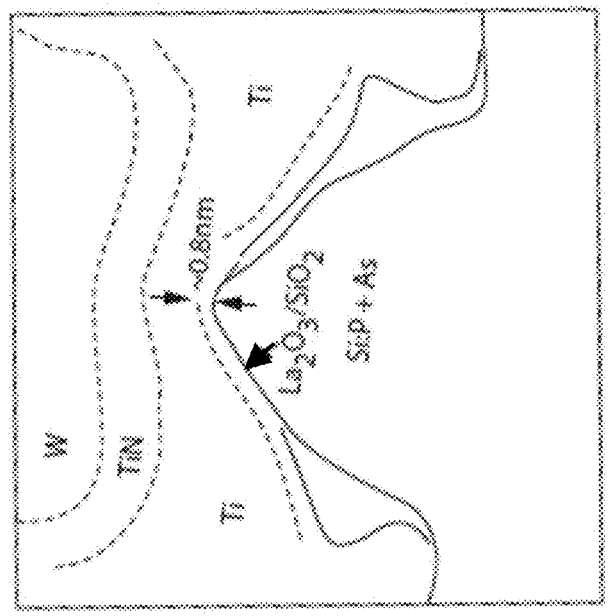
FIG. 7 is a schematic illustrating the dipole layer formed on top of the epitaxial layer according to one or more embodiments.

FIG. 7 is a schematic 700 according to one or more embodiments. In this example, FIG. 7 is representative of forming an n-type transistor, and it should be appreciated that forming a p-type transistor is analogous. In the schematic 700, the epitaxial layer 305 is silicon doped with phosphorous and arsenic, and the triangular shaped epitaxial layer 305 is designated with Si:P+As.

In FIG. 8, dipole A between layers 505 and 405 are stronger than Dipole B between layers 405 and 305. Particularly, Dipole A plays a major role for SBH lowering. Referring to FIG. 7, the thickness of the $La_2O_3/SiO_2$ dipole layer is approximately 0.8 nm. Also, in FIG. 7, the metal liner 605 is designated as Ti, the metal barrier layer 610 is designated as TiN, and the metal tungsten plug 615 is designated as W.

Further experimental data is provided below for explanation purposes and is not meant to be limiting. FIG. 8 is a conceptual view of the dipole layer 805 in the structure 100 according to an embodiment. The dipole layer 805 of the oxide layer 405 and the metal oxide layer 505 is considered as a single dipole layer. As discussed herein, the experimenters have demonstrated Schottky barrier height (SBH) modulation via insertion of the dipole layer 805, which was $La_2O_3/SiO_2$ for n-type source/drain contact, between metal layer 605 and semiconductor layer 305. The $La_2O_3$ is the high-k layer. The dipole layer 805 of a p-type source/drain contact may be $Al_2O_3/SiO_2$.

During the experiment, the experimenters recognized that the surface area enhancement engineering, (i.e., the additional cleaning discussed herein) is a beneficial part of the contact resistance improvement.

Without the surface area enhancement engineering, the dipole layer is essentially a dielectric layer, and the tunneling resistance (Rc) increased as the high-k layer increased in thickness. Particularly, resistance (Rc) initially decreased because the dipole layer 805 lowered the Schottky barrier height, and then, the Schottky barrier height increased as the high-k layer increased in thickness. Various thicknesses of ALD $La_2O_3$ film (0 to 2 nm) were deposited on the 0.3 nm-thick oxide layer to evaluate contact resistance on transmission line measurement (TLM) hardware. The experimenters examined three different base contact layers: (1) conventional contact, (2) trench contact epitaxy, and (3) trench contact epitaxy with implantation and solid phase epitaxy (SPE) to enhance dopant activation.

First, the experimenters grew the dipole layer on a conventional contact, and resistance was extremely high. Under the conventional cleaning technique without the surface area enhancement engineering, the state of the bottom surface of the trench is very poor because of contact RIE damages, polymer residue, and so forth. In such conditions, the high-k/$SiO_2$ layer did not form a dipole but just added dielectric layer resistance at the bottom of the contact.

Second, the experimenters formed the dipole layer on the trench contact epitaxy. Because the interface between the $La_2O_3/SiO_2$ dipole layer 804 and the trench epitaxial layer 305 is controlled and clean, the experimenters observed Schottky barrier height modulation, i.e., the contact resistivity (pc) decreased.

To further augment contact resistivity (pc) improvement, the experimenters performed arsenic (As) implantation and solid phase epitaxy (SPE); subsequently, the experimenters used laser spike annealing (LSA) between 800° C. to 1250° C. after trench epitaxy formation of the epitaxial layer 305 but before dipole formation of the dipole layer 805. The implantation may include annealing in very short duration at an elevated temperature of amorphous layer to enhance dopant activation. The experimenters were able to reduce contact resistivity (pc). The high-resolution STEM image 700 shows the 0.8 nm-thick "dielectrics" layer (i.e., the dipole layer 805 of layers 405 and 505) between the metal liner 605 and trench contact epitaxial layer 305, even though the $La_2O_3$ and $SiO_2$ are not distinguishable in FIG. 7. Based on contact resistivity (pc) by transmission line measurement and cross-sectional schematic 700, the estimated contact resistivity (pc) is about $3.5 \times 10^{-9}$ $\Omega$-$cm^2$ with ~0.5 nm ALD $La_2O_3$ deposition on 0.3 nm chemical oxide, where the chemical oxide was deposited on the trench epitaxial layer (Si:P) with arsenic implantation and SPE.

In one implementation, the contact resistance (Rc) may be improved (i.e., decreased) by (1) thinning the chemical oxide layer and (2) incorporation of a dopant in silicon doped with phosphorous (Si:P) trench epitaxial layer.

FIG. 9 is a flow chart 900 of a method of forming a contact according to one or more embodiments. Reference can be made to FIGS. 1-8.

At block 905, a trench 120 is opened through an interlayer dielectric layer 115 down to a substrate 105, where the interlayer dielectric layer 115 is formed on the substrate 105 such that the substrate 105 is a bottom surface of the trench 120. Reference can be made to FIG. 1.

At block 910, a cleaning process of the trench 120 is performed. At block 915, the bottom surface of the trench 120 is recessed. Examples are illustrated in FIGS. 2A, 2B, 2C.

At block 920, a trench contact epitaxial layer 305 is formed in the trench 120. Examples are illustrated in FIGS. 3A, 3B, 3C.

At block 925, an oxide layer 405 is formed on top of the trench contact epitaxial layer 305 in the trench 120. Examples are illustrated in FIGS. 4, 7, and 8.

At block 930, a metal oxide layer 505 is formed on top of the oxide layer 405 in the trench. Examples are illustrated in FIGS. 5, 7, and 8.

At block 935, a metal contact 605 is formed on top of the metal oxide layer 505, where the oxide layer 405 and the metal oxide layer 505 together form a dipole layer 805.

The cleaning process of the trench includes baking in hydrogen gas. The cleaning process of the trench further includes in-situ plasma cleaning of the trench. The in-situ plasma cleaning is with a compound of hydrogen and nitrogen, a compound of nitrogen and fluorine, or both the compound of hydrogen and nitrogen and the compound of nitrogen and fluorine.

Recessing the bottom surface of the trench includes anisotropic etching of the bottom surface of the trench along planes, where the planes (such as, for example, {111}, {113}, {001}) of the groove 205 are at angles defined by a bottom surface plane of the trench.

The dipole layer 805 is configured to reduce contact resistance (pc) between the trench contact epitaxial layer 305 and the metal contact 605 as compared to having no dipole layer present.

The trench contact epitaxial layer 305 includes facets. The substrate 105 is a fin of a transistor. The trench contact epitaxial layer 305 is formed over a source or a drain of a transistor. The trench contact epitaxial layer 305 is doped with p-type dopants and/or n-type dopants. The metal oxide layer includes material for a p-type transistor or an n-type transistor.

The metal oxide layer includes lanthanum and oxygen (e.g., $La_2O_3$) for an n-type transistor. The metal oxide layer includes aluminum and oxygen (e.g., $Al_2O_3$) for a p-type transistor.

Also, a method of forming a contact comprises performing a cleaning process of a trench, recessing a bottom surface of the trench in order to etch a grove with angled surfaces (FIGS. 2A, 2B, 2C), forming a trench contact epitaxial layer in the trench (FIGS. 3A, 3B, 3C), forming a dipole layer on top of the trench contact epitaxial layer (FIGS. 5, 7, 8), and forming a metal contact on top of the dipole layer (FIGS. 6, 7, 8).

Technical effects and benefits include improved semiconductor devices, including, for example, improved contact resistance (Rc) for sources and drains of transistors. Technical benefits provide methods for reducing S/D contact resistance which include (1) surface area enhancement engineering and (2) lower Schottky barrier height (SBH) engineering. Surface area enhancement is reducing the contact resistance by having a large cross-section because large cross-sections have a small resistance. Surface area enhancement includes providing a clean surface and formation of a faceted epitaxial layer along a contact trench. Schottky barrier height (SBH) reduction is a way to decrease contact resistivity. A dipole layer is formed to reduce Schottky barrier height. The optimized dipole layer reduces contact resistance.

It should be appreciated that the design for semiconductor devices may be included in or utilize features of an integrated circuit layout. An integrated circuit (IC) layout is also known as an IC layout, IC mask layout, or mask design. The integrated circuit layout is the representation of an integrated circuit in terms of planar geometric shapes which correspond to the patterns of metal, oxide, semiconductor layers, etc., that make up the components of the integrated circuit. Such an integrated circuit layout, including the layout of a semiconductor device, may be stored in a computer readable medium in preparation for fabrication as understood by one skilled in the art.

It will be noted that various microelectronic device fabrication methods may be utilized to fabricate the components/elements discussed herein as understood by one skilled in the art. In semiconductor device fabrication, the various processing steps fall into four general categories: deposition, removal, patterning, and modification of electrical properties.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others.

Removal is any process that removes material from the wafer: examples include etch processes (either wet or dry), and chemical-mechanical planarization (CMP), etc.

Patterning is the shaping or altering of deposited materials, and is generally referred to as lithography. For example, in conventional lithography, the wafer is coated with a chemical called a photoresist; then, a machine called a stepper focuses, aligns, and moves a mask, exposing select portions of the wafer below to short wavelength light; the exposed regions are washed away by a developer solution. After etching or other processing, the remaining photoresist is removed. Patterning also includes electron-beam lithography.

Modification of electrical properties may include doping, such as doping transistor sources and drains, generally by diffusion and/or by ion implantation. These doping processes are followed by furnace annealing or by rapid thermal annealing (RTA). Annealing serves to activate the implanted dopants.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A contact for a semiconductor device, the semiconductor device comprising:
   a trench contact epitaxial layer formed in a trench in a substrate, such that the trench contact epitaxial layer is formed to extend from within the substrate and protrude above an uppermost surface of the substrate, the trench contact epitaxial layer being in direct contact with a bottom surface of the trench, wherein the bottom surface of the trench comprises angled planes such that a center meeting point of the angled planes of the trench is a lowest part of the trench compared to both sides of the angled planes of the trench, wherein an angled portion of the trench contact epitaxial layer protrudes in an opposite direction to the center meeting point of the angled planes of the trench, the angled portion being substantially above the center meeting point;
   a dipole layer formed on top of the trench contact epitaxial layer, the dipole layer comprising a shape of the angled portion of the trench contact epitaxial layer; and
   a metal contact formed on top of the dipole layer.

2. The semiconductor device of claim 1, wherein the trench is formed through an interlayer dielectric layer.

3. The semiconductor device of claim 2, wherein the interlayer dielectric layer is on top of a substrate.

4. The semiconductor device of claim 3, wherein the trench contact epitaxial layer is partially formed in the substrate.

5. The semiconductor device of claim 1, wherein the dipole layer includes an oxide layer formed on top of the trench contact epitaxial layer in the trench and a metal oxide layer formed on top of the oxide layer in the trench.

6. The semiconductor device of claim 5, wherein the metal oxide layer includes material for a p-type transistor.

7. The semiconductor device of claim 5, wherein the metal oxide layer includes material for an n-type transistor.

8. The semiconductor device of claim 5, wherein the metal oxide layer includes lanthanum and oxygen for an n-type transistor.

9. The semiconductor device of claim 5, wherein the metal oxide layer includes aluminum and oxygen for a p-type transistor.

10. The semiconductor device of claim 1, wherein a bottom surface of the trench has been recessed.

11. The semiconductor device of claim 10, wherein the bottom surface of the trench has been recessed along planes, such that the planes are at angles defined by a bottom surface plane of the trench.

12. The semiconductor device of claim 1, wherein the dipole layer is configured to reduce contact resistance between the trench contact epitaxial layer and the metal contact as compared to having no dipole layer present.

13. The semiconductor device of claim 1, wherein the trench contact epitaxial layer includes facets.

14. The semiconductor device claim 1, wherein the trench contact epitaxial layer is doped with p-type dopants.

15. The semiconductor device claim 1, wherein the trench contact epitaxial layer is doped with n-type dopants.

16. The semiconductor device of claim 1, wherein the angled portion forms a peak of the trench contact epitaxial layer above the center of the recessed angled planes.

* * * * *